United States Patent [19]

Ko et al.

[11] 3,999,097

[45] Dec. 21, 1976

[54] ION IMPLANTATION APPARATUS UTILIZING MULTIPLE APERTURE SOURCE PLATE AND SINGLE APERTURE ACCEL-DECEL SYSTEM

[75] Inventors: Wen Chuang Ko, Wappingers Falls; Albert Schien, Carmel; James Robert Winnard, Poughkeepsie, all of N.Y.

[73] Assignee: International Business Machines Corporation, Armonk, N.Y.

[22] Filed: June 30, 1975

[21] Appl. No.: 592,149

[52] U.S. Cl. .............................. 313/361; 313/458; 313/411; 219/121 EB; 250/307; 250/492 A; 315/31 R
[51] Int. Cl.² ..................... H05H 7/06; H01J 21/50
[58] Field of Search .......... 313/458, 409, 411, 361; 219/121 EB; 250/423, 424, 492 A, 285, 489, 306, 307; 315/30, 31 R

[56] References Cited

UNITED STATES PATENTS

| | | | |
|---|---|---|---|
| 3,117,022 | 1/1964 | Bronson | 117/212 |
| 3,394,217 | 7/1968 | Fisk | 13/31 |
| 3,406,305 | 10/1968 | Schiller et al. | 313/83 |
| 3,434,894 | 3/1969 | Gale | 313/83 |
| 3,491,236 | 1/1970 | Newberry | 250/49.5 |
| 3,558,967 | 1/1971 | Miriam | 315/3.5 |
| 3,585,397 | 6/1971 | Brewer | 250/492 A |
| 3,843,901 | 10/1974 | Standaart | 313/409 |

OTHER PUBLICATIONS

"A Multiampere Duo Pigatron Ion Source," by R. C. Davis et al., Review of Scientific Instruments, vol. 43, No. 2, Feb. 1972, (pp. 278–283).
"Production of Large Area High Current Ion Beams," by Y. Okamoto and H. Tamagawa, Review of Scientific Instruments, vol. 43, No. 8, Aug. 1972, (pp. 1193–1197).
"Record of the 11th Symposium of Electron, Ion, and Laser Beam Technology".

*Primary Examiner*—R. V. Rolinec
*Assistant Examiner*—Vincent J. Sunderdick
*Attorney, Agent, or Firm*—James M. Thomson

[57] ABSTRACT

In an ion implantation apparatus, means for forming multiple, separate parallel ion beams, each having a predetermined spot diameter, and means for focusing each of said ion beams upon a predetermined chip area of a target wafer whereby multiple chip areas upon the wafer can be simultaneously implanted with prescribed ion dosages.

5 Claims, 3 Drawing Figures

ION IMPLANTATION APPARATUS UTILIZING MULTIPLE APERTURE SOURCE PLATE AND SINGLE APERTURE ACCEL-DECEL SYSTEM

BACKGROUND OF THE INVENTION

The present invention relates to an improved ion implantation apparatus. More particularly, the invention concerns an ion implantation apparatus in which multiple ion beams of predetermined spot size are focused upon discrete chip areas of a traget wafer whereby simultaneous implantation of such chip areas can be achieved.

In the usual ion implantation apparatus, a single beam of ions is deflected in a predetermined pattern or scanning mode to successively cover multiple chip areas upon a target wafer, whereby each of the chip areas eventually receives a prescribed dosage or implantation of ions. Such implantation steps are used, for example, in the production of microelectronic devices. However, in the microfabrication of large numbers of devices, the utilization of a single ion beam and a progressive scanning arrangement require a significant expenditure of time.

Accordingly, a need exists in ion implantation technology, as it is applied to the microfabrication of electronic devices, for an implantation apparatus capable of simultaneously carrying out the implantation step with respect to multiple chip areas defined upon a target wafer.

It should be recognized that multiple electron beams have been utilized heretofore in the prior art. For example, U.S. Pat. No. 3,770,934 to Randmer describes an electron beam heating apparatus for heating large workpieces by electron bombardment, which includes means for forming and beaming a plurality of electron beams. In addition, U.S. Pat. No. 3,394,217 to Fisk describes a method and apparatus for controlling plural electron beams, where a target material confined within a crucible is heated by bombardment with such beams. It should be apparent that the requirements of systems for electron beam heating are significantly different from the requirements for control of ion beams in connection with ion implantation apparatus, however.

In addition, U.S. Pat. No. 3,491,236 to Newberry discloses an apparatus useful in fabrication of microelectronic circuit patterns by means of applying electron beam patterns to a target 13 to expose successive portions of the target. A matrix illustrated in FIG. 5 is provided to control the deflection of the electron beam to successive target areas. The matrix is constructed of a plurality of "lenslets", with each "lenslet" being adapted to control the impingement of a main electron beam on a given area of the target.

There is a suggestion in the Newberry disclosure that the main electron beam could be utilized to flood a plurality of "lenslets" at one time and thereby impinge upon plural target areas simultaneously. There is a further suggestion by Newberry that the invention could be utilized to control an ion beam rather than an electron beam, if desired. However, it should be apparent that certain inherent limitations of the Newberry system would preclude its effective use in connection with ion implantation apparatus. Thus, the Newberry matrix, utilizing a plurality of "lenslets", results in overlap of electron exposure from several adjacent "lenslets" onto any given target area. This precludes the necessary resolution required for ion implantation.

Moreover, it should be recognized that the effects of space-charge in an ion beam are more pronounced than spacecharge effects occurring within an electron beam. Accordingly, the use of a planar matrix such as that disclosed by Newberry would be inadequate to maintain control of a plurality of individual ion beams, due to the more pronounced effects of space-charge in the ion beam system.

Other systems are known which utilize aperture plates having multiple apertures formed therein to produce ion beams of wide diameters through the merging of plural beamlets emitted from the aperture plate into a single beam. Such systems have been used for ion beam machining and the like, where there was apparently no need to maintain a plurality of discrete beams.

SUMMARY OF THE INVENTION

Accordingly, it is an object of the invention to provide an ion implantation apparatus wherein plural target areas can be implanted with ions simultaneously.

It is a further object of the invention to provide an ion implantation system wherein a plurality of separate ion beams each having a predetermined spot size are utilized to simultaneously ion implant a corresponding plurality of individual microelectronic devices located upon the target wafer.

These and other objects of the invention are attained in a system utilizing an ion source and including a concave source electrode, having a plurality of apertures formed therein, in conjunction with single aperture extraction plates and/or accel-decel plates which are controlled so that multiple discrete ion beams are produced. More particularly, the electric field created by the extraction plate and the deceleration plate is adjusted such that the total field strength does not cause the multiple extracted beams to converge or disperse as the beams traverse the target path. This is achieved by controlling the field created by energization of these plates such that the total convergent force created by the concave source electrode and the other plates substantially balances the electrostatic force of repulsion existing between the discrete beams due to ion-charge and space-charge effects. The discrete ion beams are further focused and deflected by a deflecting magnet to impinge upon corresponding predetermined plurality of chip areas at the target whereby multiple simultaneous ion implantation of chips is accomplished.

BRIEF DESCRIPTION OF THE DRAWINGS

The foregoing and other objects, features and advantages of the invention will become apparent from the following detailed description of the invention taken in conjunction with the accompanying drawings wherein.

DESCRIPTION OF THE INVENTION

Figure 1:
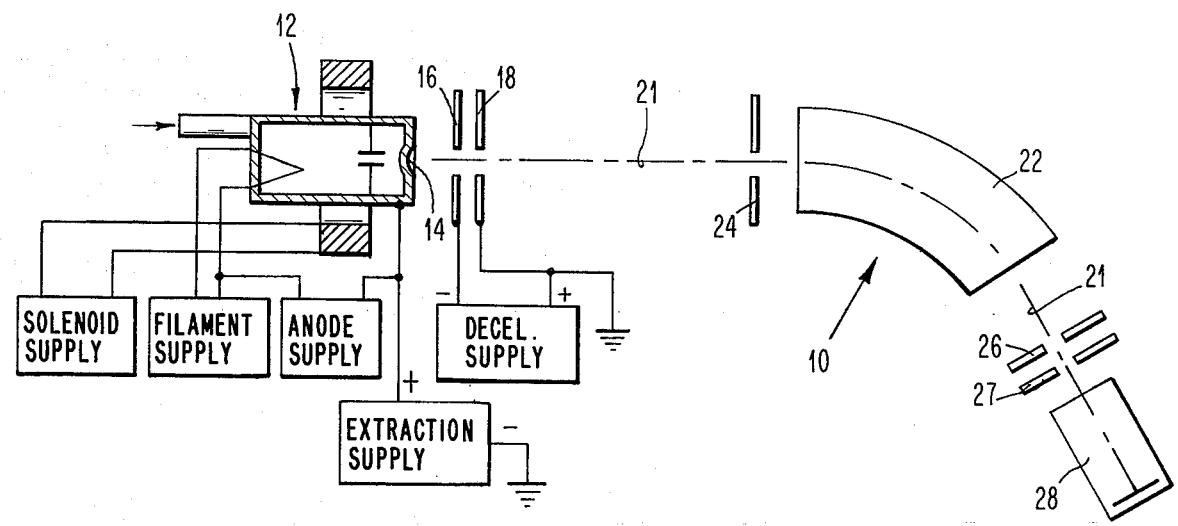
FIG. 1 discloses a schematic representation of an ion implantation apparatus designed in accordance with the invention.

Referring now to the drawings and particularly to FIG. 1, an ion implantation apparatus utilizing suitable elements to produce a multiple ion beam configuration is disclosed. It should be recognized that the apparatus of FIG. 1 is schematic in nature and that the system of the invention is envisioned to include, generally, the stages of a conventional single beam ion implantation system such as an ion source, electrostatic focusing section, acceleration section, beam deflection section and target section. For example, U.S. Pat. No. 3,756,862 discloses a single beam ion implantation system which includes all the necessary elements to carry out high resolution ion implantation in the microfabrication of electronic parts.

Referring now to FIG. 1, an ion implantation apparatus 10 is illustrated generally including an ion source 12. Ion source 12 can be comprised of any suitable high density source, although in the embodiment illustrated a hot filament electron impact source is illustrated, adapted to be operated in an oscillating electron discharge mode.

Figure 2:
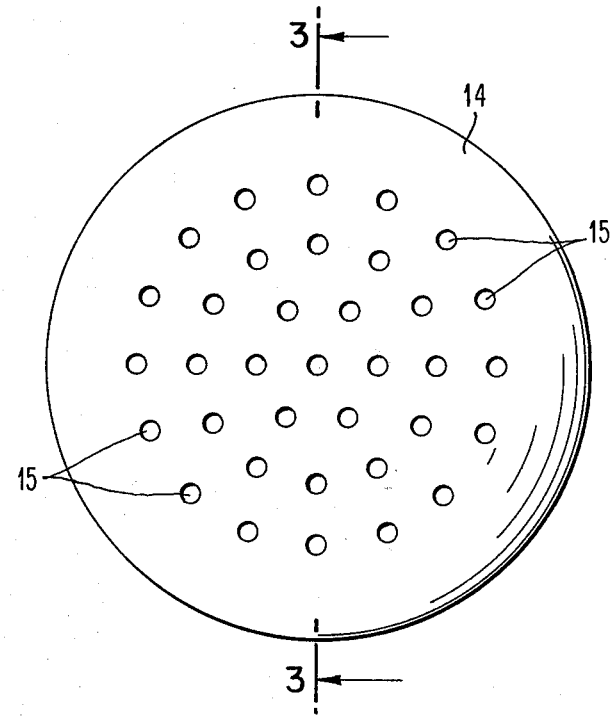
FIG. 2 is a front view of a concave source electrode having multiple apertures formed therein which is adapated for use in an apparatus of FIG. 1.
Figure 3:
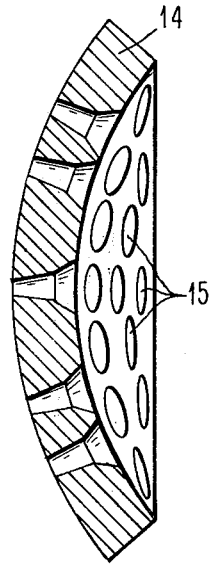
FIG. 3 is a side view of the electrode illustrated in FIG. 2.

A multiple aperture source electrode 14 is illustrated in FIG. 1 and particularly illustrated in FIGS. 2 and 3. Electrode 14 is fabricated of a plate of conductive material such as graphite, for example, having multiple apertures formed therein. In the embodiment illustrated, the apertures are oriented in a pattern of four concentric circular arrays including 1, 6, 12 and 16 holes, respectively, arranged within an overall diameter of about 1.2 inches. In the embodiment illustrated, each hole 15 is countersunk within the source electrode to form an 80° − 90° conical expansion cone through which the ions can traverse although this is not essential. The plate of which the source electrode is fabricated is further formed with a concave radius of curvature, as illustrated particularly in FIG. 3, by any suitable means such as machining. In the embodiment illustrated it is envisioned that the radius of curvature be between 2 and 7 inches, as required, to balance the optical characteristics of the extraction system with the remaining optics of the implantation system. The source electrode is otherwise adapted to be operated at a positive potential V+, corresponding to the desired beam energy derived from an extraction supply, as illustrated.

It should be apparent that the source electrode could be constructed with any desired multiple of apertures from four or five up to several hundred in number, and that the apertures could be arranged in any convenient pattern so as to provide multiple ion beams for implanting microelectronic chips arranged in a particular configuration upon a target wafer.

An accel electrode or extraction electrode 16 is also provided, adapted to be held at a negative potential V−, by the decel supply illustrated, to extract ions from the source and to maintain secondary electrons in the downstream beam whereby neutralization is accomplished and undesired expansion of the ion beam is prevented. A decel electrode 18 is also provided, adapted to be maintained at ground potential. It should be recognized that the bias voltages described herein for the electrodes are suitable for operation of the ion implantation apparatus disclosed, but that such voltages might be varied in the operation of the device if desired.

Multiple ion beams extracted from the ion source by the electrode arrangement disclosed are transmitted along a beam path generally indicated at 21 to a double focusing deflecting magnet 22 of conventional design. The multiple parallel beams are further defined by slits, 24, 26 located on either side of the deflecting magnet and the beam is focused upon a target generally indicated at 28. A mask defining slit 27 is included in the apparatus, as illustrated.

In the operation of the apparatus illustrated for ion implantation purposes, a target is provided comprising a conventional wafer having a plurality of microelectronic chips located thereon for which it is desired to achieve ion implantation by exposure to ion beams.

The illustrated electrode system is utilized to provide a plurality of separate ion beams from source 12 and it should be apparent that the initial orientation of the apertures, due to the concavity of electrode 14 is such that the individual beams will converge. However, due to the existence of an inherent electrostatic force of repulsion between the discrete beams caused by space-charge of the ions, the individual beams tend to diverge as they traverse the beam path. Accordingly, the acceleration electrode is maintained at a negative voltage which, coupled with the converging influence of source electrode 14, creates a field which causes the multiple beams to converge by an amount that overcomes the tendency of the beams to diverge due to space-charge characteristics. It has been found that the use of an accel and a decal electrode having single large apertures in combination with a multi-apertures source electrode in the configuration shown provides several advantages such as improved focusing over multi-aperture accel/decel system because balancing of the beam sizes with the total optical system is less critical and ion impingement upon the accel/decel electrodes is minimized. The system also provides improved transport efficiency from source to target as a result of the minimal ion impingement. Furthermore, the life of electrodes is substantially extended with a commensurate increase in reliability.

The density of the ions being forced against the source electrode also tends to determine the diameter of each individual ion beam during extraction. Consequently, the ion density within the source tends to influence the beam spacing. Accordingly, a dense source is utilized to enhance the formation and maintenance of discrete ion beams.

It has been found that by utilizing the configuration shown that thirty-five discrete ion beams can be created and maintained in a parallel configuration along beam path 21 into deflecting magnet 22. The beam spot diameters are in the order of 150 millimeters prior to deflection by the magnet.

It has been found that utilizing a high density ion source and plural ion beams of the described configuration that suitable ion implantation on a given chip can be carried out by an individual beam well within a greatly reduced time frame over that capable through the use of scanning of a higher intensity single ion beam. Accordingly, the system described results in a significantly reduced operating time in the ion implantation of multiple chips upon a given target.

What is claimed is:

1. An ion implantation apparatus for providing a group of discrete ion beams which may be used to simultaneously impinge upon a corresponding plurality of discrete chip areas located upon a target wafer comprising;
    an ion source,
    a multiple-apertured source electrode of concave profile arranged at the extraction side of said source, single-apertured extraction electrode means associated with said source electrode and single-apertured deceleration electrode means associated with said extraction electrode means for extracting a plurality of discrete ion beams from said source through said apertures, said ion beams being oriented in a relatively parallel direction along a beam path, and deflection magnet means associated with said beam path for deflecting said plurality of ion beams without destroying the discrete nature of the beams to focus said beams upon a corresponding plurality of microelectronic chips arranged upon a target wafer.

2. The apparatus of claim 1 wherein the total field created by energization of said source electrode and said extraction electrode means, together with the convergent effect of said concave source electrode substantially balances the electrostatic force of repulsion existing between discrete ion beams of said plurality whereby said parallel beam orientation is achieved.

3. The apparatus of claim 2 wherein said source electrode is provided with a plurality of apertures in the range of four to several hundred in number.

4. The apparatus of claim 3 wherein said plurality is 35.

5. The apparatus of claim 1 wherein said source electrode has a radius of curvature between 2 and 7 inches and wherein said multiple apertures are arranged in symmetrical configuration about a central aperture.

* * * * *